United States Patent
Yun et al.

(10) Patent No.: US 12,557,461 B2
(45) Date of Patent: Feb. 17, 2026

(54) DISPLAY DEVICE

(71) Applicant: Samsung Display Co., LTD., Yongin-si (KR)

(72) Inventors: Hae Ju Yun, Hwaseong-si (KR); Won Tae Kim, Suwon-si (KR); Soo Hyun Moon, Suwon-si (KR); Jun Seok Min, Suwon-si (KR); Woo Guen Jang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 570 days.

(21) Appl. No.: 17/969,049

(22) Filed: Oct. 19, 2022

(65) Prior Publication Data

US 2023/0275115 A1 Aug. 31, 2023

(30) Foreign Application Priority Data

Feb. 28, 2022 (KR) .................. 10-2022-0026096

(51) Int. Cl.
*H10H 29/14* (2025.01)
*G09F 9/302* (2006.01)
(Continued)

(52) U.S. Cl.
CPC ......... *H10H 29/142* (2025.01); *G09F 9/3026* (2013.01); *G09F 9/33* (2013.01);
(Continued)

(58) Field of Classification Search
CPC H10H 29/142; H10H 20/8513; G09F 9/3026; G09F 9/33; G09F 9/3023; H10K 59/18
See application file for complete search history.

(56) References Cited

U.S. PATENT DOCUMENTS 12,016,194 B2  6/2024  Park et al.
12,329,012 B2  6/2025  Ahn et al.
(Continued)

FOREIGN PATENT DOCUMENTS

CN  104865741  8/2015
CN  103917000  6/2017
(Continued)

*Primary Examiner* — Tucker J Wright
(74) *Attorney, Agent, or Firm* — Womble Bond Dickinson (US) LLP

(57) ABSTRACT

A display device includes a display area including a plurality of light emitting area including a first light emitting area, a second light emitting area, a third light emitting area, and a light blocking area disposed between adjacent ones of the plurality of light emitting areas, and a non-display area disposed adjacent to the display area, light emitting elements disposed on a substrate in each of the first light emitting area, the second light emitting area, and the third light emitting area, and a light conversion layer disposed on the light emitting elements. The light conversion layer includes a first wavelength conversion part disposed in the first light emitting area, a second wavelength conversion part disposed in the second light emitting area, a first light transmissive part disposed in the third light emitting area, and a bank disposed in the light blocking area. The non-display area is disposed on an edge of the display area. A second light transmissive part is further disposed in the non-display area.

18 Claims, 12 Drawing Sheets

(51) Int. Cl.
  *G09F 9/33*   (2006.01)
  *H10H 20/831*  (2025.01)
  *H10H 20/851*  (2025.01)
  *H10H 20/857*  (2025.01)

(52) U.S. Cl.
  CPC .... *H10H 20/8312* (2025.01); *H10H 20/8514* (2025.01); *H10H 20/857* (2025.01)

(56) References Cited

U.S. PATENT DOCUMENTS

| | | |
|---|---|---|
| 12,336,287 B2 | 6/2025 | Jang et al. |
| 2015/0144900 A1* | 5/2015 | Lee ................. H10K 50/82 |
| | | 257/40 |
| 2018/0190747 A1* | 7/2018 | Son ................. H01L 25/0753 |
| 2023/0120521 A1 | 4/2023 | Yun et al. |
| 2023/0133818 A1 | 5/2023 | Yun et al. |
| 2024/0306420 A1 | 9/2024 | Park et al. |

FOREIGN PATENT DOCUMENTS

| | | |
|---|---|---|
| EP | 4167052 | 4/2023 |
| EP | 4174622 | 5/2023 |
| KR | 10-1542425 | 8/2015 |
| KR | 10-2017-0032503 | 3/2017 |
| KR | 10-2021-0082291 A | 7/2021 |
| KR | 10-2021-0146468 A | 12/2021 |
| KR | 10-2022-0021997 A | 2/2022 |
| KR | 10-2023-0053798 | 4/2023 |
| KR | 10-2023-0061617 | 5/2023 |

\* cited by examiner

DISPLAY DEVICE

CROSS-REFERENCE TO RELATED APPLICATION

This application claims priority to and benefit of Korean Patent Application No. 10-2022-0026096 under 35 U.S.C. § 119, filed on Feb. 28, 2022, in the Korean Intellectual Property Office (KIPO), the contents of which are incorporated by reference in its entirety.

BACKGROUND

1. Technical Field

The disclosure relates to a display device.

2. Description of the Related Art

As the information society develops, the demand for a display device for displaying an image is increasing in various forms. For example, the display device has been applied to various electronic devices such as smartphones, digital cameras, laptop computers, navigation devices, and smart televisions. The display device may be a flat panel display device such as a liquid crystal display device, a field emission display device, or an organic light emitting display device. Among the flat panel display devices, the light emitting display device may include a light emitting element in which each pixel of a display panel may emit light by itself, thereby displaying an image without a backlight unit providing light to the display panel.

When the display device is manufactured in a large size, a defect rate of the light emitting element may increase due to an increase in the number of pixels, and productivity or reliability may decrease. In order to solve such a problem, a tiled display device may realize a screen having a large size by connecting multiple display devices having a relatively small size to each other. The tiled display device may include boundary portions called seams between the display devices consisting of a non-display area or a bezel area of each of the display devices adjacent to each other. When image is displayed on the entire screen, the boundary portions between the display devices may provide a sense of discontinuity to the entire screen to decrease a degree of immersion of the image.

SUMMARY

Aspects of the disclosure provide a display device capable of removing a sense of discontinuity between a plurality of display devices and improving a degree of immersion of an image by preventing boundary portions between the plurality of display devices from being recognized.

However, aspects of the disclosure are not restricted to those set forth herein. The above and other aspects of the disclosure will become more apparent to one of ordinary skill in the art to which the disclosure pertains by referencing the detailed description of the disclosure given below.

According to an aspect of the disclosure, a display device may include a display area including a plurality of light emitting areas including a first light emitting area, a second light emitting area, and a third light emitting area, a light blocking area disposed between adjacent ones of the plurality of light emitting areas, a non-display area disposed adjacent to the display area, light emitting elements disposed on a substrate in each of the first light emitting area, the second light emitting area, and the third light emitting area, and a light conversion layer disposed on the light emitting elements. The light conversion layer may include a first wavelength conversion part disposed in the first light emitting area, a second wavelength conversion part disposed in the second light emitting area, a first light transmissive part disposed in the third light emitting area, a second light transmissive part disposed in the non-display area, and a bank disposed in the light blocking area. The non-display area may be disposed on an edge of the display area.

The first light emitting area, the second light emitting area, the third light emitting area, and the light blocking area may constitute a pixel. The third light emitting area of the pixel adjacent to the non-display area may be disposed adjacent to the non-display area in a plan view.

The third light emitting area may directly contact the non-display area in a plan view.

The first light transmissive part may directly contact the second light transmissive part.

The first wavelength conversion part may include a first wavelength shifter. The first wavelength shifter may convert a wavelength of light from the light emitting element into red light.

The second wavelength conversion part may include a second wavelength shifter. The second wavelength shifter may convert the wavelength of the light from the light emitting element into green light.

The first light transmissive part and the second light transmissive part may include a scatterer. The scatterer may scatter the light from the light emitting element.

The display device may further include a color filter layer disposed on the light conversion layer. The color filter layer may include a first color filter disposed in the first light emitting area, a second color filter disposed in the second light emitting area, and a third color filter disposed in the third light emitting area.

The first color filter, the second color filter, and the third color filter may be disposed in the light blocking area and in the non-display area.

In the non-display area, the first color filter, the second color filter, and the third color filter may be sequentially stacked to form a light blocking pattern.

In the non-display area, the light blocking pattern may include a slit portion penetrating through the light blocking pattern in a thickness direction.

A width of the slit portion may be in a range of about 10 to about 30% of a width of the non-display area.

According to an embodiment of the disclosure, a tiled display device may include a first display device, a second display device disposed adjacent to the first display device, and a sealing part between the first display device and the second display device. Each of the first display device and the second display device may include a display area including a plurality of light emitting areas including a first light emitting area, a second light emitting area, and a third light emitting area, and a light blocking area disposed between adjacent ones of the plurality of light emitting areas, a non-display area disposed adjacent to the display area, light emitting elements disposed on a substrate in each of the first light emitting area, the second light emitting area, and the third light emitting area, and a light conversion layer disposed on the light emitting elements. The light conversion layer of each of the first display device and the second display device may include a first wavelength conversion part disposed in the first light emitting area, a second wavelength conversion part disposed in the second light emitting area, a first light transmissive part disposed in the third light emitting area, and a bank disposed in the light blocking area. A second light transmissive part may be disposed in each of the non-display area of the first display device adjacent to the second display device and the non-display area of the second display device adjacent to the first display device.

The tiled display device may further include a color filter layer disposed on the light conversion layer. The color filter layer may include a first color filter disposed in the first light emitting area, a second color filter disposed in the second light emitting area, and a third color filter disposed in the third light emitting area. The first color filter, the second color filter, and the third color filter may be disposed in the light blocking area and in the non-display area.

In the non-display area, the first color filter, the second color filter, and the third color filter may be sequentially stacked to form a light blocking pattern.

In the non-display area, the light blocking pattern may include a slit portion penetrating through the light blocking pattern in a thickness direction.

A width of the slit portion may be in a range of about 10 to about 30% of a width of the non-display area.

The second light transmissive part the first display device may directly contact the first light transmissive part of the first display device.

The second light transmissive part of the second display device may directly contact the first wavelength conversion part of the first light emitting area of the second display device.

The first wavelength conversion part may include a first wavelength shifter. The first wavelength shifter may convert a wavelength of light from the light emitting element into red light. The second wavelength conversion part may include a second wavelength shifter. The second wavelength shifter may convert the wavelength of the light from the light emitting element into green light. The first light transmissive part and the second light transmissive part may include a scatterer, and the scatterer may scatter the light from the light emitting element.

According to the display device and the tiled display device according to the embodiments, a sense of discontinuity between a plurality of display devices may be removed and a degree of immersion of an image may be improved by preventing the non-display areas or boundary portions between the plurality of display devices from being recognized.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
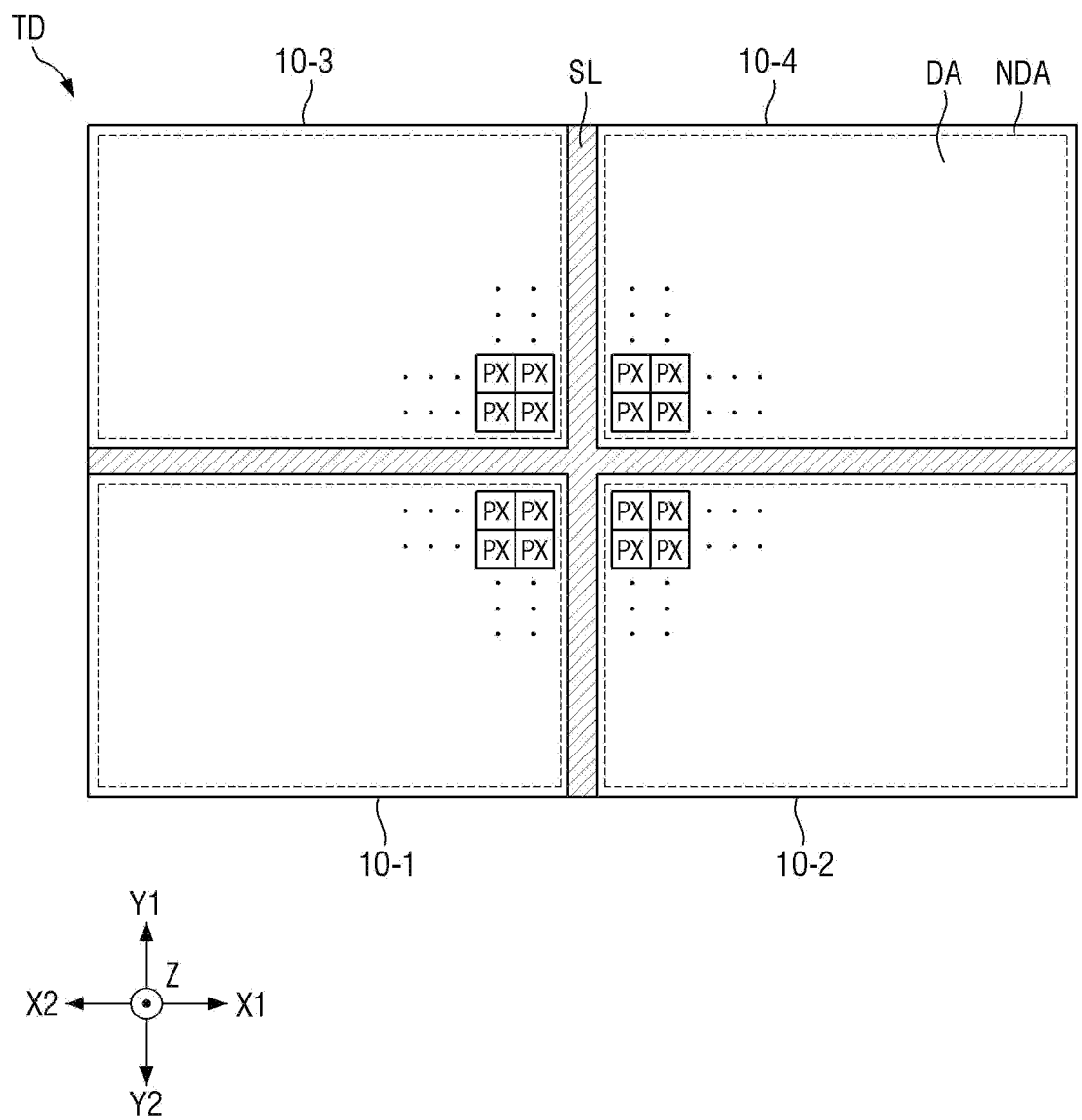
FIG. 1 is a plan view illustrating a tiled display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Although the terms "first", "second", and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath", "below", "under", "lower", "above", "upper", "over", "higher", "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a", "an", and "the" are intended to include the plural forms as well, unless the context clearly indicates otherwise. Moreover, the terms "comprises", "comprising", "includes", and/or "including", when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially", "about", and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Hereinafter, detailed embodiments of the disclosure will be described with reference to the accompanying drawings.

FIG. 1 is a plan view illustrating a tiled display device according to an embodiment.

Referring to FIG. 1, a tiled display device TD may have a rectangular planar shape. However, the planar shape of the tiled display device TD is not limited thereto and may have a square, circular, oval, or other polygonal shapes. Hereinafter, the tiled display device TD with a rectangular planar shape will be described. The tiled display device TD having the rectangular planar shape may include long sides extending in first directions X1 and X2 and short sides extending in second directions Y1 and Y2. A corner where the long side and the short side of the tiled display device TD meet may be angled as illustrated in FIG. 1, but is not limited thereto and may be rounded.

The tiled display device TD may be a large-sized display device in which multiple display devices are arranged in a grid shape and the display devices adjacent to each other are connected to each other at an attachment portion. For example, the tiled display device TD may include multiple display devices. The display devices may be connected to each other in the first directions X1 and X2 and/or the second directions Y1 and Y2, and the tiled display device TD may have a specific shape. For example, each of the display devices may have the same size, but are not limited thereto. In another embodiment, the display devices may have different sizes. For example, each of the display devices may have a rectangular shape including long sides and short sides. The display devices may be disposed with the long sides and/or the short sides connected to each other. Some display devices may be disposed at edges of the tiled display device TD, and may form a side of the tiled display device TD. Some display devices may be disposed at corners of the tiled display device TD, and may form two adjacent sides of the tiled display device TD. Some other display devices may be disposed inside the tiled display device TD and may be surrounded by other display devices.

Hereinafter, for convenience of description, the tiled display device TD is shown as including four display devices. For example, the tiled display device TD may include a first display device 10-1, a second display device 10-2 positioned on a side of the first display device 10-1 in the first direction X1, a third display device 10-3 positioned on a side of the first display device 10-1 in the second direction Y1, and a fourth display device 10-4 positioned on a side of the third display device 10-3 in the first direction X1.

In the following, in the case where the display devices 10-1, 10-2, 10-3, and 10-4 do not need to be particularly distinguished while describing the first display device 10-1, detailed descriptions of the other display devices 10-2, 10-3, and 10-4 will be omitted. However, in case that it is necessary to be distinguished from the first display device 10-1, the other display devices 10-2, 10-3, and 10-4 will be described.

The first display device 10-1 may include a display area DA and a non-display area NDA. The display area DA may include multiple pixels PX to display an image. The pixels PX may be arranged in a matrix. The non-display area NDA may be disposed adjacent to the display area DA or surround the display area DA, and may not display an image. The non-display area NDA may completely surround the display area DA in a plan view. The non-display area NDA may be positioned at an edge portion of the display area DA.

The display devices 10-1 to 10-4 may be connected to each other by a connection member. The connection member may include a sealing part SL, but is not limited thereto. In the tiled display device TD including the first to fourth display devices 10-1 to 10-4, the sealing part SL may be positioned at a boundary of each of the display devices 10-1 to 10-4 in a plan view. For example, the sealing part SL may be disposed between the non-display area NDA of the first display device 10-1 and the non-display area NDA of the second display device 10-2 to connect the first display device 10-1 and the second display device 10-2 to each other, may be disposed between the non-display area NDA of the first display device 10-1 and the non-display area NDA of the third display device 10-3 to connect the first display device 10-1 and the third display device 10-3 to each other, may be disposed between the non-display area NDA of the third display device 10-3 and the non-display area NDA of the fourth display device 10-4 to connect the third display device 10-3 and the fourth display device 10-4 to each other, and may be disposed between the non-display area NDA of the fourth display device 10-4 and the non-display area NDA of the second display device 10-2 to connect the fourth display device 10-4 and the second display device 10-2 to each other.

The sealing part SL may be continuously disposed. For example, the sealing part SL may extend in the first directions X1 and X2 and the second directions Y1 and Y2, and portions extending in the first directions X1 and X2 and the second directions Y1 and Y2, respectively, may intersect.

Figure 2:
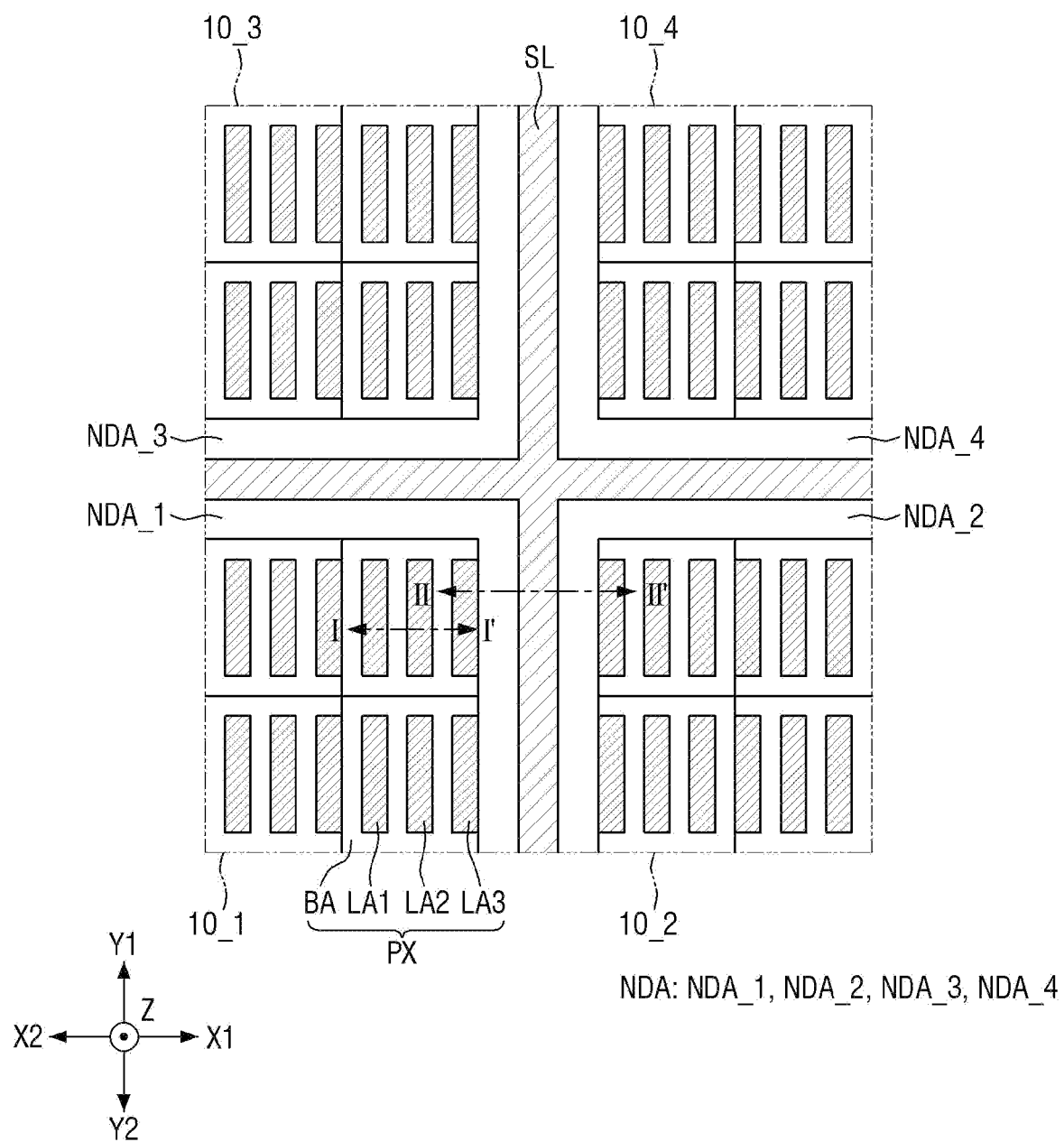
FIG. 2 is an enlarged plan view illustrating boundaries between a first display device, a second display device, a third display device, and a fourth display device of FIG. 1.

FIG. 2 is an enlarged plan view illustrating boundaries between a first display device, a second display device, a third display device, and a fourth display device of FIG. 1.

Referring to FIG. 2, each of the pixels of the display devices 10-1 to 10-4 may include light emitting areas LA1, LA2, and LA3 defined by a pixel defining layer, and may emit light having a peak wavelength (e.g., a predetermined or selectable peak wavelength) through the light emitting areas LA1, LA2, and LA3. For example, the display area DA of the display device may include first to third light emitting areas LA1, LA2, and LA3. Each of the first to third light emitting areas LA1, LA2, and LA3 may be an area in which light generated by a light emitting element of the display device is emitted to the outside of the display device.

The first to third light emitting areas LA1, LA2, and LA3 may emit light having a peak wavelength to the outside of the display device. The first light emitting area LA1 may emit light of a first color, the second light emitting area LA2 may emit light of a second color, and the third light emitting area LA3 may emit light of a third color. For example, the light of the first color may be red light having a peak wavelength in the range of about 610 nm to about 650 nm, the light of the second color may be green light having a peak wavelength in the range of about 510 nm to about 550 nm, and the light of the third color may be blue light having a peak wavelength in the range of about 440 nm to about 480 nm, but the disclosure is not limited thereto.

The first to third light emitting areas LA1, LA2, and LA3 may be sequentially and repeatedly disposed in the first directions X1 and X2 of the display area DA. For example, a width of the first light emitting area LA1 in the first directions X1 and X2 may be wider than a width of the second light emitting area LA2 in the first directions, and the width of the second light emitting area LA2 in the first directions X1 and X2 may be wider than a width of the third light emitting area LA3 in the first directions X1 and X2. In another embodiment, the width of the first light emitting area LA1 in the first directions X1 and X2, the width of the second light emitting area LA2 in the first directions X1 and X2, and the width of the third light emitting area LA3 in the first directions X1 and X2 may be substantially the same.

For example, an area of the first light emitting area LA1 may be greater than that of the second light emitting area LA2, and the area of the second light emitting area LA2 may be greater than that of the third light emitting area LA3. In another embodiment, the area of the first light emitting area LA1, the area of the second light emitting area LA2, and the area of the third light emitting area LA3 may be substantially the same.

The display area DA of the display device may include a light blocking area BA positioned between the light emitting areas LA1, LA2, and LA3 adjacent to each other. For example, the light blocking area BA may be disposed between the first light emitting area LA1 and the second light emitting area LA2 and between the second light emitting area LA2 and the third light emitting area LA3.

As illustrated in FIG. 2, the third light emitting area LA3 of the pixel PX may be disposed adjacent to the non-display area NDA in a plan view. For example, in a plan view, the third light emitting area LA3 may directly contact the non-display area NDA. As illustrated in FIG. 2, the non-display area NDA may include a first non-display area NDA-1 adjacent to the display area DA of the first display device 10-1, a second non-display area NDA-2 adjacent to the display area DA of the second display device 10-2, a third non-display area NDA-3 adjacent to the display area DA of the third display device 10-3, and a fourth non-display area NDA-4 adjacent to the display area DA of the fourth display device 10-4.

Figure 3:
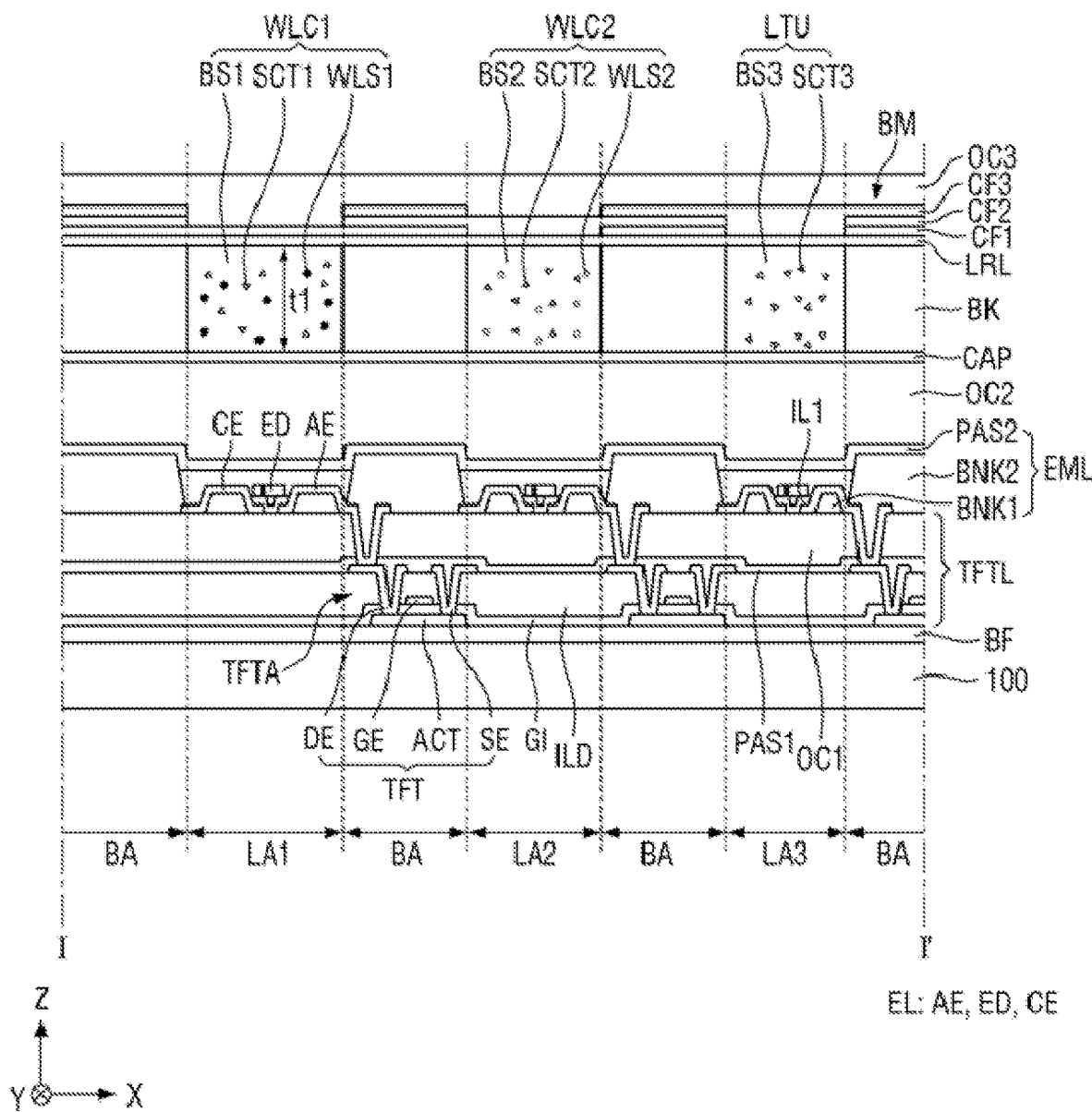
FIG. 3 is a schematic cross-sectional view taken along line I-I' of FIG. 2.

FIG. 3 is a schematic cross-sectional view taken along line I-I' of the enlarged view of FIG. 2.

Referring to FIG. 3, the display area DA of the display device may include first to third light emitting areas LA1, LA2, and LA3. Each of the first to third light emitting areas LA1, LA2, and LA3 may be an area in which light generated by a light emitting element of the display device is emitted to the outside of the display device.

The display device may include a substrate 100, a buffer layer BF, a thin film transistor layer TFTL, and a light emitting element layer EML.

The substrate 100 may be a base substrate or a base member, and may include an insulating material such as a polymer resin. For example, the substrate 100 may be a rigid substrate.

The buffer layer BF may be disposed on the substrate 100. The buffer layer BF may include an inorganic film capable of preventing permeation of air and/or moisture.

The thin film transistor layer TFTL may include a thin film transistor TFT, a gate insulating film GI, an interlayer insulating film ILD, a first passivation layer PAS1, and a first planarization layer OC1.

The thin film transistor TFT may be disposed on the buffer layer BF, and may constitute a pixel circuit of each of the pixels. The thin film transistor TFT may include a semiconductor layer ACT, a gate electrode GE, a source electrode SE, and a drain electrode DE. An area in which the thin film transistor TFT including the semiconductor layer ACT, the gate electrode GE, the source electrode SE, and the drain electrode DE is disposed may be referred to as a thin film transistor area TFTA as illustrated in FIG. 3.

The semiconductor layer ACT may be provided on the buffer layer BF. The semiconductor layer ACT may overlap the gate electrode GE, the source electrode SE, and the drain electrode DE in a thickness direction (or Z-axis direction). The semiconductor layer ACT may directly contact the source electrode SE and the drain electrode DE, and may face the gate electrode GE with the gate insulating film GI interposed therebetween.

The gate electrode GE may be disposed on an upper side of the gate insulating film GI. The gate electrode GE may overlap the semiconductor layer ACT with the gate insulating film GI interposed therebetween in the thickness direction.

The source electrode SE and the drain electrode DE may be disposed to be spaced apart from each other on the interlayer insulating film ILD. The source electrode SE may electrically contact an end of the semiconductor layer ACT through a contact hole provided in the gate insulating film GI and the interlayer insulating film ILD. The drain electrode DE may electrically contact another end of the semiconductor layer ACT through the contact hole provided in the gate insulating film GI and the interlayer insulating film ILD. The drain electrode DE may be electrically connected to a first electrode AE of a light emitting member EL through a contact hole provided in the first passivation layer PAS1 and the first planarization layer OC1.

The thin film transistor area TFTA described above may be disposed to substantially overlap the light blocking area BA in the thickness direction.

The gate insulating film GI may be provided on an upper side of the semiconductor layer ACT. For example, the gate insulating film GI may be disposed on the upper side of the semiconductor layer ACT and the buffer layer BF, and may insulate the semiconductor layer ACT and the gate electrode GE. The gate insulating film GI may include a contact hole through which the source electrode SE penetrates and a contact hole through which the drain electrode DE penetrates.

The interlayer insulating film ILD may be disposed on an upper side of the gate electrode GE. For example, the interlayer insulating film ILD may include a contact hole through which the source electrode SE penetrates and a contact hole through which the drain electrode DE penetrates.

The first passivation layer PAS1 may be provided on an upper side of the thin film transistor TFT to protect the thin film transistor TFT. For example, the first passivation layer PAS1 may include a contact hole through which the first electrode AE penetrates.

The first planarization layer OC1 may be provided on an upper side of the first passivation layer PAS1 to planarize above the thin film transistor TFT. For example, the first planarization layer OC1 may include a contact hole through which the first electrode AE of the light emitting member EL penetrates.

The light emitting element layer EML may include a light emitting member EL, a first bank BNK1, a second bank BNK2, and a second passivation layer PAS2.

The light emitting member EL may be provided on the thin film transistor TFT. The light emitting member EL may include a first electrode AE, a second electrode CE, and a light emitting element ED.

The first electrode AE may be provided on an upper side of the first planarization layer OC1. For example, the first electrode AE may be disposed on the first bank BNK1 and the first planarization layer OC1, and may cover the first bank BNK1. The first electrode AE may be disposed to overlap one of the first to third light emitting areas LA1, LA2, and LA3 defined by the second bank BNK2 in the thickness direction. The first electrode AE may be electrically connected to the drain electrode DE of the thin film transistor TFT.

The second electrode CE may be provided on an upper side of the first planarization layer OC1. For example, the second electrode CE may be disposed on the first bank BNK1 and the first planarization layer OC1, and may cover the first bank BNK1. The second electrode CE may be disposed to overlap one of the first to third light emitting areas LA1, LA2, and LA3 defined by the second bank BNK2 in the thickness direction. For example, the second electrode CE may receive a common voltage supplied to all pixels.

A first insulating layer IL1 may cover a portion of the first electrode AE and a portion of the second electrode CE adjacent to each other, and may insulate the first electrode AE and the second electrode CE from each other.

The light emitting element ED may be disposed between the first electrode AE and the second electrode CE on the upper side of the first planarization layer OC1. The light emitting element ED may be disposed on the first insulating layer IL1. An end of the light emitting element ED may be electrically connected to the first electrode AE, and another end of the light emitting element ED may be electrically connected to the second electrode CE. For example, the light emitting elements ED may include an active layer having the same material to emit light of the same wavelength band or light of the same color. Light emitted from each of the first to third light emitting areas LA1, LA2, and LA3 may have the same color. For example, the light emitting elements ED may emit light of a third color or blue light having a peak wavelength in the range of about 440 nm to about 480 nm.

The second bank BNK2 may be disposed on the first planarization layer OC1 and may define the first to third light emitting areas LA1, LA2, and LA3. For example, the second bank BNK2 may surround each of the first to third light emitting areas LA1, LA2, and LA3, but is not limited thereto. The second bank BNK2 may be disposed in the light blocking areas BA.

The second passivation layer PAS2 may be disposed on the light emitting members EL and the second bank BNK2. The second passivation layer PAS2 may cover the light emitting members EL and may protect the light emitting members EL.

The display device may include a second planarization layer OC2, a capping layer CAP, a light blocking member BK, a light conversion layer including a first wavelength conversion part WLC1, a second wavelength conversion part WLC2, and a light transmissive part (or first transmissive part) LTU (LTU_1 in FIG. 7), a low refractive layer LRL, a color filter layer including a first color filter CF1, a second color filter CF2, a third color filter CF3, and a light blocking pattern BM (BM_1 in FIG. 7), and a third planarization layer OC3. Although not illustrated, the display device may also include an encapsulation layer on the third planarization layer OC3.

The second planarization layer OC2 may be provided on an upper side of the light emitting element layer EML to planarize above the light emitting element layer EML. The second planarization layer OC2 may include an organic material.

The capping layer CAP may be disposed on the second planarization layer OC2. The capping layer CAP may seal bottom surfaces of the first and second wavelength conversion parts WLC1 and WLC2 and the light transmissive part LTU. The capping layer CAP may include an inorganic material.

The light blocking member BK may be disposed in the light blocking area BA on the capping layer CAP. The light blocking member BK may overlap the second bank BNK2 in the thickness direction. The light blocking member BK may block transmission of light.

The light blocking member BK may include an organic light blocking material and a liquid repellent component.

As the light blocking member BK includes the liquid repellent component, the light blocking member BK may separate light emitting areas LA such as the first and second wavelength conversion parts WLC1 and WLC2 and the light transmissive part LTU.

The first wavelength conversion part WLC1 may be disposed in the first light emitting area LA1 on the capping layer CAP. The first wavelength conversion part WLC1 may be surrounded by the light blocking member BK. The first wavelength conversion part WLC1 may include a first base resin BS1, a first scatterer SCT1, and a first wavelength shifter WLS1.

The first base resin BS1 may include a material having a relatively high light transmittance. The first base resin BS1 may include a transparent organic material. For example, the first base resin BS1 may include at least one organic material such as an epoxy-based resin, an acrylic resin, a cardo-based resin, and an imide-based resin.

The first scatterer SCT1 may have a refractive index different from that of the first base resin BS1, and may form an optical interface with the first base resin BS1. For example, the first scatterer SCT1 may include a light scattering material or a light scattering particle scattering at least a portion of transmitted light.

The first wavelength shifter WLS1 may convert or shift a peak wavelength of incident light to a first peak wavelength. For example, the first wavelength shifter WLS1 may convert the blue light provided from the light emitting element ED into red light having a single peak wavelength in the range of about 610 nm to about 650 nm and may emit red light. The first wavelength shifter WLS1 may include a quantum dot, a quantum rod, or a phosphor. The quantum dot may be a particulate matter that emits a specific color as electrons transition from a conduction band to a valence band.

The light emitted from the first wavelength shifter WLS1 may have a light emitting wavelength spectrum full width of half maximum (FWHM) of about 45 nm or less, about 40 nm or less, or about 30 nm or less, and color purity and color reproducibility of colors displayed by the display device may be further improved.

A portion of the blue light provided from the light emitting element layer EML may be transmitted through the first wavelength conversion part WLC1 without being converted into red light by the first wavelength shifter WLS1. Blue light incident on the first color filter CF1 without being converted by the first wavelength conversion part WLS1 provided from the light emitting element layer EML may be blocked by the first color filter CF1. The red light converted by the first wavelength conversion part WLC1 from the blue light provided from the light emitting element ED may be transmitted through the first color filter CF1 and emitted to the outside. Accordingly, the first light emitting area LA1 may emit red light.

The second wavelength conversion part WLC2 may be disposed in the second light emitting area LA2 on the capping layer CAP. The second wavelength conversion part WLC2 may be surrounded by the light blocking member BK. The second wavelength conversion part WLC2 may include a second base resin BS2, a second scatterer SCT2, and a second wavelength shifter WLS2.

The second base resin BS2 may include a material having a relatively high light transmittance. The second base resin BS2 may include a transparent organic material. For example, the second base resin BS2 may include at least one organic material such as an epoxy-based resin, an acrylic resin, a cardo-based resin, and an imide-based resin.

The second scatterer SCT2 may have a refractive index different from that of the second base resin BS2, and may form an optical interface with the second base resin BS2. For example, the second scatterer SCT2 may include a light scattering material or a light scattering particle scattering at least a portion of transmitted light.

The second wavelength shifter WLS2 may convert or shift the peak wavelength of the incident light to a second peak wavelength different from the first peak wavelength of the first wavelength shifter WLS1. For example, the second wavelength shifter WLS2 may convert the blue light provided from the light emitting element ED into green light having a single peak wavelength in the range of about 510 nm to about 550 nm and may emit green light. The second wavelength shifter WLS2 may be a quantum dot, a quantum rod, or a phosphor. The second wavelength shifter WLS2 may include the same material as the material that may be used to form the first wavelength shifter WLS1, e.g., as described herein.

The light emitted from the second wavelength shifter WLS2 may have a light emitting wavelength spectrum full width of half maximum (FWHM) of about 45 nm or less, about 40 nm or less, or about 30 nm or less, and color purity and color reproducibility of colors displayed by the display device may be further improved.

A portion of the blue light provided from the light emitting element layer EML may be transmitted through the second wavelength conversion part WLC2 without being converted into green light by the second wavelength shifter WLS2. Blue incident on the second color filter CF2 without being converted by the second wavelength conversion part WLS2 provided from the light emitting element layer EML may be blocked by the second color filter CF2. The green light converted by the second wavelength conversion part WLC2 from the blue light provided from the light emitting element ED may be transmitted through the second color filter CF2 and emitted to the outside. Accordingly, the second light emitting area LA2 may emit green light.

The light transmissive part LTU may be disposed in the third light emitting area LA3 on the capping layer CAP. The light transmissive part LTU may be surrounded by the light blocking member BK. The light transmissive part LTU may transmit incident light therethrough while maintaining a peak wavelength of the incident light. The light transmissive part LTU may include a third base resin BS3 and a third scatterer SCT3.

The third base resin BS3 may include a material having a relatively high light transmittance. The third base resin BS3 may include a transparent organic material. For example, the third base resin BS3 may include at least one organic material such as an epoxy-based resin, an acrylic resin, a cardo-based resin, and an imide-based resin.

The third scatterer SCT3 may have a refractive index different from that of the third base resin BS3, and may form an optical interface with the third base resin BS3. For example, the third scatterer SCT3 may include a light scattering material or a light scattering particle scattering at least a portion of transmitted light.

As the first and second wavelength conversion parts WLC1 and WLC2 and the light transmissive part LTU are disposed on the second planarization layer OC2 and the capping layer CAP, the display device may not require a separate substrate for the first and second wavelength conversion parts WLC1 and WLC2 and the light transmissive part LTU.

The low refractive layer LRL may cover the first and second wavelength conversion parts WLC1 and WLC2, the light transmissive part LTU, and the light blocking member BK. The low refractive layer LRL may have a refractive index smaller than a refractive index of each of the components positioned in the light conversion layer. The low refractive layer LRL may include a low refractive inorganic material.

The light blocking pattern BM may be disposed in the light blocking area BA on the low refractive layer LRL. The light blocking pattern BM may overlap the light blocking member BK and/or the second bank BNK2 in the thickness direction. The light blocking pattern BM may block transmission of light. Before describing a detailed structure of the light blocking pattern BM, the first to third color filters CF1, CF2, and CF3 will be described.

The first color filter CF1 may be disposed in the first light emitting area LA1 on the low refractive layer LRL. The first color filter CF1 may be also disposed in the light blocking area BA on the low refractive layer LRL. The first color filter CF1 may overlap the first wavelength conversion part WLC1 in the thickness direction. The first color filter CF1 may selectively transmit the light of the first color (e.g., the red light), and block or absorb the light of the second color (e.g., the greed light) and the light of the third color (e.g., the blue light).

The second color filter CF2 may be disposed in the second light emitting area LA2 on the low refractive layer LRL. The second color filter CF2 may be also disposed in the light blocking area BA on the low refractive layer LRL. The second color filter CF2 may overlap the second wavelength conversion part WLC2 in the thickness direction. The second color filter CF2 may selectively transmit the light of the second color (e.g., the green light), and block or absorb the light of the first color (e.g., the red light) and the light of the third color (e.g., the blue light).

The third color filter CF3 may be disposed in the third light emitting area LA3 on the third planarization layer OC3. The third color filter CF3 may be also disposed in the light blocking area BA on the low refractive layer LRL. The third color filter CF3 may overlap the light transmissive part LTU in the thickness direction. The third color filter CF3 may selectively transmit the light of the third color (e.g., the blue light), and block or absorb the light of the first color (e.g., the red light) and the light of the second color (e.g., the green light).

Portion of the first to third color filters CF1 to CF3 disposed in the light blocking area BA may form the light blocking pattern BM. In an embodiment, the light blocking pattern BM may have a structure in which the first color filter CF1, the second color filter CF2, and the third color filter CF3 on the low refractive layer LRL on the light blocking area BA are sequentially stacked.

In the case in which the light blocking pattern BM has the structure in which the first color filter CF1, the second color filter CF2, and the third color filter CF3 on the low refractive layer LRL are sequentially stacked on the light blocking area BA, in case that external light is incident on the light blocking area BA, all of the light of the first color and the light of the second color except for the light of the third color may be absorbed by the third color filter CF3 of the light blocking pattern BM while the external light is transmitted through the third color filter CF3 of the light blocking pattern BM, and the light of the third color may also be absorbed while being transmitted through the second and first color filters CF2 and CF1 of the light blocking pattern BM.

The third planarization layer OC3 may be disposed on the color filter layer. The third planarization layer OC3 may planarize a step of the color filter layer. The third planarization layer OC3 may include an organic material that may form the above-described second planarization layer OC2.

Figure 4:
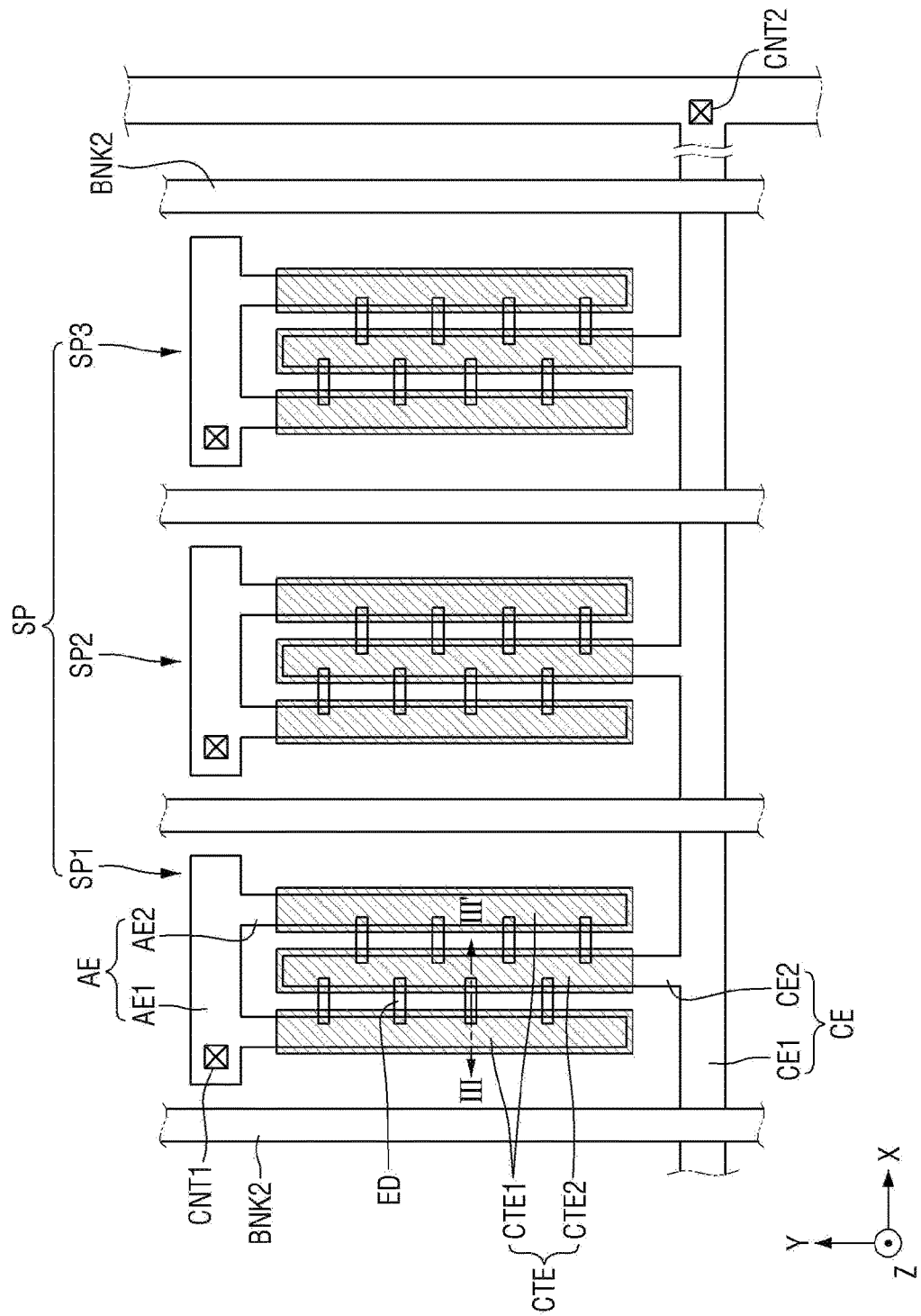
FIG. 4 is a plan view illustrating a pixel of the display device according to an embodiment.

FIG. 4 is a plan view illustrating a pixel of the display device according to an embodiment.

Referring to FIG. 4, each of the pixels may include first to third sub-pixels SP1, SP2, and SP3. Each of the first to third sub-pixels may correspond to each of the first to third light emitting areas LA1, LA2, and LA3. The light emitting element ED of each of the first to third sub-pixels may emit light through the first to third light emitting areas LA1, LA2, and LA3.

Each of the first to third sub-pixels SP1, SP2, and SP3 may emit light of the same color. For example, each of the first to third sub-pixels may include the same type of light emitting element ED, and may emit the light of the third color or the blue light. In another embodiment, the first sub-pixel SP1 may emit light of the first color or the red light, the second sub-pixel SP2 may emit light of the second color or the green light, and the third sub-pixel SP3 may emit light of the third color or the blue light.

Each of the first to third sub-pixels may include first and second electrodes AE and CE, a light emitting element ED, multiple contact electrodes CTE, and multiple second banks BNK2.

The first and second electrodes AE and CE may be electrically connected to the light emitting element ED to apply a predetermined (or selectable) voltage, and the light emitting element ED may emit light in a specific wavelength band. At least a portion of the first and second electrodes AE and CE may form an electric field in the pixel, and the light emitting element ED may be aligned by the electric field.

For example, the first electrode AE may be a pixel electrode separated for each of the first to third sub-pixels, and the second electrode CE may be a common electrode commonly electrically connected to the first to third sub-pixels. One of the first electrode AE and the second electrode CE may be an anode electrode of the light emitting element ED, and another one of the first electrode AE and the second electrode CE may be a cathode electrode of the light emitting element ED.

The first electrode AE may include a first electrode stem portion AE1 extending in the first direction X and at least one first electrode branch portion AE2 branching from the first electrode stem portion AE1 and extending in the second direction Y.

The first electrode stem portion AE1 of each of the first to third sub-pixels may be spaced apart from the first electrode stem portion AE1 of the adjacent sub-pixel, and the first electrode stem portion AE1 may be disposed collinear with the first electrode stem portions AE1 of the adjacent sub-pixels in the first direction X. The first electrode stem portions AE1 of the first to third sub-pixels may receive different signals and may be independently driven.

The first electrode branch portion AE2 may branch from the first electrode stem portion AE1 and extend in the second direction Y. An end of the first electrode branch portion AE2 may be electrically connected to the first electrode stem portion AE1, and another end of the first electrode branch portion AE2 may be spaced apart from the second electrode stem portion CE1 facing the first electrode stem portion AE1.

The second electrode CE may include a second electrode stem portion CE1 extending in the first direction X and a second electrode branch portion CE2 branching from the second electrode stem portion CE1 and extending in the second direction Y. The second electrode stem portion CE1 of each of the first to third sub-pixels may be electrically connected to the second electrode stem portion CE1 of the adjacent sub-pixel. The second electrode stem portion CE1 may extend in the first direction X across the pixels. The second electrode stem portion CE1 may be electrically connected to an outer portion of the display area DA or a portion extending in a direction from the non-display area NDA.

The second electrode branch portion CE2 may be spaced apart from the first electrode branch portion AE2 to face each other. An end of the second electrode branch portion CE2 may be electrically connected to the second electrode stem portion CE1, and another end of the second electrode branch portion CE2 may be spaced apart from the first electrode stem portion AE1.

The first electrode AE may be electrically connected to the thin film transistor layer TFTL of the display device through a first contact hole CNT1, and the second electrode CE may be electrically connected to a power electrode of the display device through a second contact hole CNT2. For example, the first contact hole CNT1 may be disposed in each of the first electrode stem portions AE1, and the second contact hole CNT2 may be disposed in the second electrode stem portion CE1, but is not limited thereto.

The second bank BNK2 may be disposed at a boundary between the pixels. The first electrode stem portions AE1 may be spaced apart from each other by the second bank BNK2. The second bank BNK2 may extend in the second direction Y, and may be disposed at a boundary between the pixels SP arranged in the first direction X. The second bank BNK2 may also be disposed at a boundary between the pixels SP arranged in the second direction Y. The second bank BNK2 may define a boundary between the pixels.

The second bank BNK2 may prevent an ink from crossing the boundary between the pixels SP in case that the ink in which the light emitting element ED is dispersed is sprayed at the time of manufacturing the display device. The second bank BNK2 may separate the different light emitting elements ED from each other so that inks in which the different light emitting elements ED are dispersed do not mix with each other.

The light emitting element ED may be disposed between the first electrode AE and the second electrode CE. An end of the light emitting element ED may be electrically connected to the first electrode AE, and another end of the light emitting element ED may be electrically connected to the second electrode CE.

The light emitting elements ED may be disposed to be spaced apart from each other, and may be aligned substantially parallel to each other. A distance between the light emitting elements ED spaced apart from each other is not particularly limited.

The light emitting elements ED may include active layers having the same material to emit light of the same wavelength band or light of the same color. The first to third sub-pixels may emit light of the same color. For example, the light emitting elements ED may emit light of a third color or blue light having a peak wavelength in the range of about 440 nm to about 480 nm.

The contact electrode CTE may include first and second contact electrodes CTE1 and CTE2. The first contact electrode CTE1 may cover portions of the first electrode branch portion AE2 and the light emitting element ED, and may electrically connect the first electrode branch portion AE2 and the light emitting element ED to each other. The second contact electrode CTE2 may cover portions of the second electrode branch portion CE2 and the light emitting element ED, and may electrically connect the second electrode branch portion CE2 and the light emitting element ED to each other.

The first contact electrode CTE1 may be disposed on the first electrode branch portion AE2 and extend in the second direction Y. The first contact electrode CTE1 may electrically contact an end of the light emitting element ED. The light emitting element ED may be electrically connected to the first electrode AE through the first contact electrode CTE1.

The second contact electrode CTE2 may be disposed on the second electrode branch portion CE2 and extend in the second direction Y. The second contact electrode CTE2 may be spaced apart from the first contact electrode CTE1 in the first direction X. The second contact electrode CTE2 may electrically contact another end of the light emitting element ED. The light emitting element ED may be electrically connected to the second electrode CE through the second contact electrode CTE2.

Figure 5:
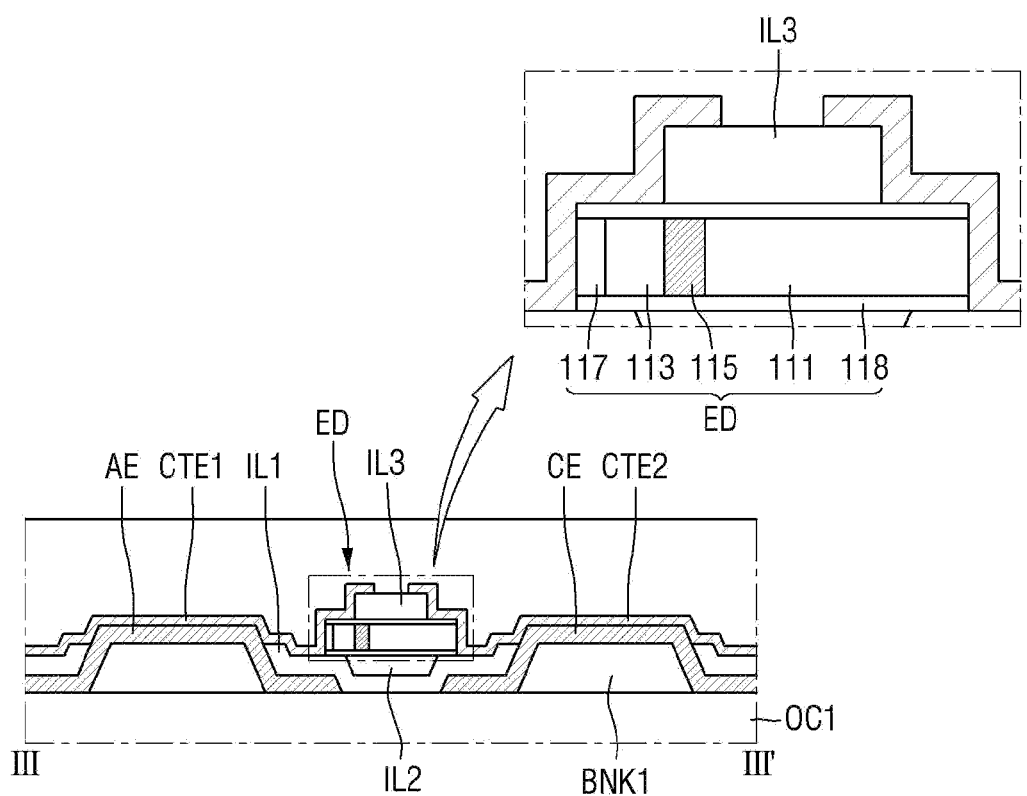
FIG. 5 is a schematic cross-sectional view taken along line III-III' of FIG. 4.

FIG. 5 is a schematic cross-sectional view taken along line III-III' of FIG. 4.

Referring to FIG. 5, the light emitting element layer EML of the display device may be disposed on the thin film transistor layer TFTL, and may include first to third insulating layers IL1, IL2, and IL3.

The first banks BNK1 may be disposed in each of the first to third light emitting areas LA1, LA2, and LA3. Each of the first banks BNK1 may correspond to the first electrode AE or the second electrode CE. Each of the first and second electrodes AE and CE may be disposed on the corresponding first bank BNK1. For example, the first banks BNK1 may be disposed on the first planarization layer OC1, and side surfaces of each of the first banks BNK1 may be inclined from the first planarization layer OC1. The inclined surface of the first bank BNK1 may reflect light emitted from the light emitting element ED.

Referring to FIG. 5 together with FIG. 4, the first electrode stem portion AE1 may include the first contact hole CNT1 penetrating through the first planarization layer OC1. The first electrode stem portion AE1 may be electrically connected to the thin film transistor TFT through the first contact hole CNT1.

The second electrode stem portion CE1 may extend in the first direction X and may be disposed in a non-light emitting area where the light emitting element ED is not disposed. The second electrode stem portion CE1 may include the second contact hole CNT2 penetrating through the first planarization layer OC1. The second electrode stem portion CE1 may be electrically connected to a power electrode through the second contact hole CNT2. The second electrode CE may receive a predetermined (or selectable) electrical signal from the power electrode.

The first and second electrodes AE and CE may include a transparent conductive material. The first and second electrodes AE and CE may include a conductive material having a high reflectivity. The first and second electrodes AE and CE may have a structure in which one or more layers made of a transparent conductive material and one or more layers made of metal having a high reflectivity are stacked each other or may be formed as one layer including a transparent conductive material and metal having a high reflectivity.

The first insulating layer IL1 may be disposed on the planarization layer OC1, the first electrode AE, and the second electrode CE. The first insulating layer IL1 may cover a portion of each of the first and second electrodes AE and CE.

The first insulating layer IL1 may protect the first and second electrodes AE and CE, and insulate the first and second electrodes AE and CE from each other. The first insulating layer IL1 may prevent the light emitting element ED from being in direct contact with and being damaged by other members.

The light emitting element ED may be disposed between the first electrode AE and the second electrode CE on the first and second insulating layers IL1 and IL2. An end of the light emitting element ED may be electrically connected to the first electrode AE, and another end of the light emitting element ED may be electrically connected to the second electrode CE.

The third insulating layer IL3 may be disposed on a portion of the light emitting element ED disposed between the first and second electrodes AE and CE. The third insulating layer IL3 may partially surround an outer surface of the light emitting element ED. The third insulating layer IL3 may protect the light emitting element ED. The third insulating layer IL3 may surround the outer surface of the light emitting element ED.

The contact electrode CTE may include first and second contact electrodes CTE1 and CTE2. The first contact electrode CTE1 may cover portions of the first electrode branch portion AE2 and the light emitting element ED, and may electrically connect the first electrode branch portion AE2 and the light emitting element ED to each other. The second contact electrode CTE2 may cover portions of the second electrode branch portion CE2 and the light emitting element ED, and may electrically connect the second electrode branch portion CE2 and the light emitting element ED to each other.

The first contact electrode CTE1 may be disposed on the first electrode branch portion AE2 and extend in the second direction Y. The first contact electrode CTE1 may electrically contact an end of the light emitting element ED. The light emitting element ED may be electrically connected to the first electrode AE through the first contact electrode CTE1.

The second contact electrode CTE2 may be disposed on the second electrode branch portion CE2 and extend in the second direction Y. The second contact electrode CTE2 may be spaced apart from the first contact electrode CTE1 in the first direction X. The second contact electrode CTE2 may electrically contact another end of the light emitting element ED. The light emitting element ED may be electrically connected to the second electrode CE through the second contact electrode CTE2.

The contact electrode CTE may include a conductive material.

Figure 6:
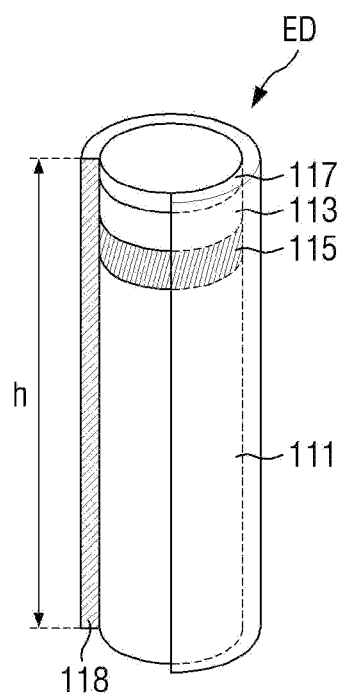
FIG. 6 is a view illustrating a light emitting element according to an embodiment.

FIG. 6 is a view illustrating a light emitting element according to an embodiment.

Referring to FIG. 6, the light emitting element ED may be a light emitting diode. The light emitting element ED may have a size of a micro-meter or a nano-meter, and may be an inorganic light emitting diode including an inorganic material. The inorganic light emitting diode may be aligned between the two electrodes in response to an electric field formed between the two electrodes facing each other in a specific direction.

The light emitting element ED may have a shape extending in a direction. The light emitting element ED may have a shape such as a rod, a wire, or a tube. The light emitting element ED may include a first semiconductor layer 111, a second semiconductor layer 113, an active layer 115, an electrode layer 117, and an insulating film 118.

The first semiconductor layer 111 may be an n-type semiconductor. The second semiconductor layer 113 may be disposed on the active layer 115. Each of the first and second semiconductor layers 111 and 113 may be configured as one layer, but is not limited thereto.

The active layer 115 may be disposed between the first and second semiconductor layers 111 and 113. The active layer 115 may include a material having a single or multiple quantum well structure. In case that the active layer 115 includes the material having the multiple quantum well structure, multiple quantum layers and well layers may be alternately stacked each other.

Light emitted from the active layer 115 may be emitted in a length direction of the light emitting element ED, and may also be emitted from both sides thereof. A direction of the light emitted from the active layer 115 may not be limited.

The electrode layer 117 may be an ohmic contact electrode. In another embodiment, the electrode layer 117 may be a Schottky contact electrode. The light emitting element ED may include at least one electrode layer 117.

The insulating film 118 may surround outer surfaces of the semiconductor layers and the electrode layer. The insulating film 118 may surround at least an outer surface of the active layer 115 and may extend in a direction in which the light emitting element ED extends. The insulating film 118 may protect the light emitting element ED.

The insulating film 118 may include materials having insulating properties, for example, silicon oxide (SiOx), silicon nitride (SiNx), silicon oxynitride (SiOxNy), aluminum nitride (AlN), and aluminum oxide ($Al_2O_3$).

An outer surface of the insulating film 118 may be surface-treated. When the display device is manufactured, the light emitting element ED may be sprayed and aligned on the electrode in a state of being dispersed in ink.

Figure 7:
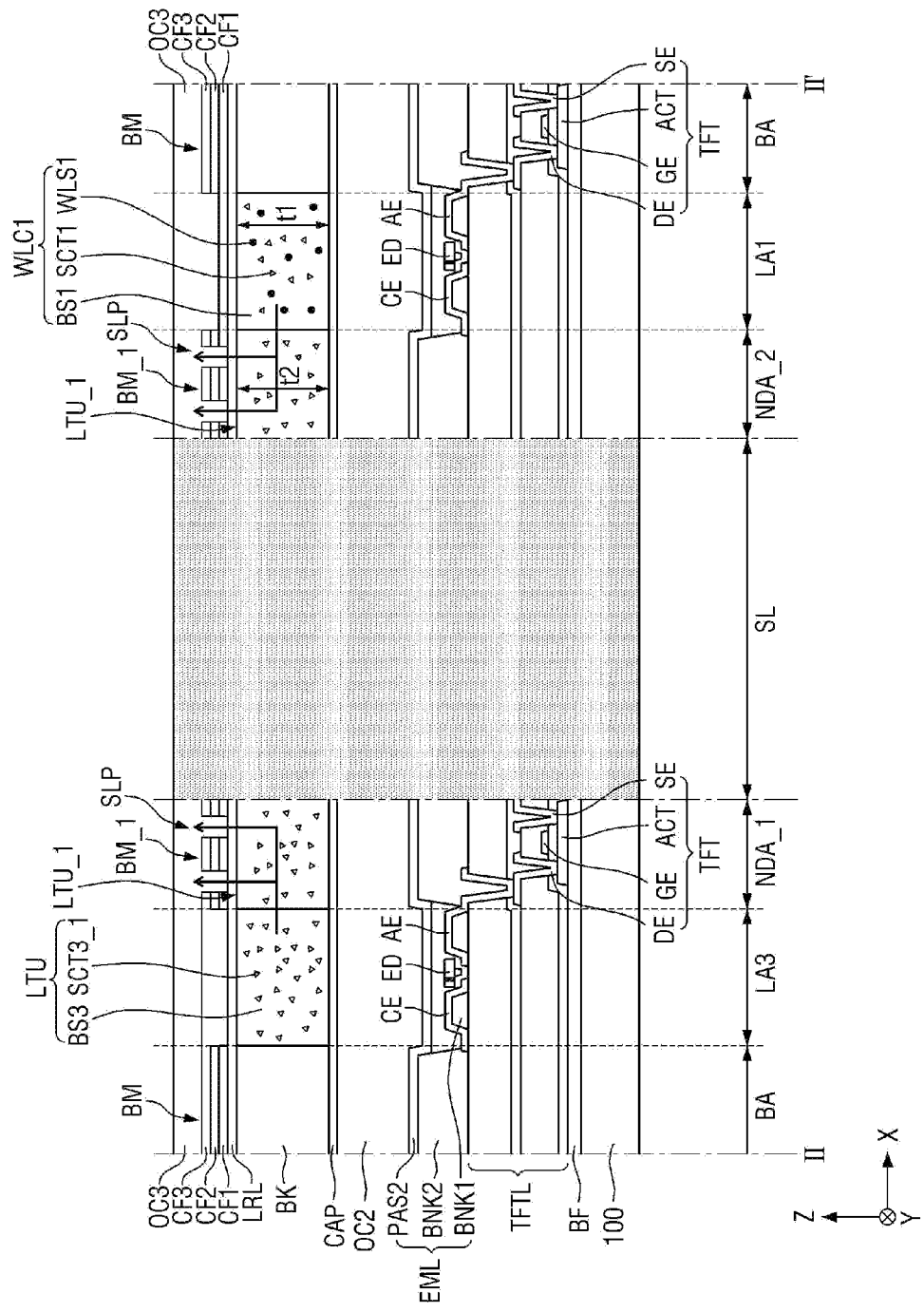
FIG. 7 is a schematic cross-sectional view taken along line II-II' of FIG. 2.

FIG. 7 is a schematic cross-sectional view taken along line II-II' of FIG. 2. While referring to FIG. 7, reference is also made to FIG. 2. In FIG. 7, a portion of the first display device 10-1 adjacent to the second display device 10-2, a portion of the second display device 10-2 adjacent to the first display device 10-1, and the sealing part SL are illustrated. In the description of FIG. 7, a redundant description of the portion already described in FIG. 3 will be omitted.

Referring to FIGS. 2 and 7, the light conversion layer may further include a second light transmissive part LTU_1 including the same material as the light transmissive part LTU disposed in the third light emitting area LA3. The second light transmissive part LTU_1 may be disposed in the first non-display area NDA-1 and the second non-display area NDA-2. The second light transmissive part LTU_1 may include a 3-1th scatterer SCT3_1, and the 3-1th scatterer SCT3_1 and the third scatterer SCT3 may include the same material. However, in some embodiments, a diameter of the 3-1th scatterer SCT3_1 may be different from a diameter of the third scatterer SCT3. For example, the diameter of the third scatterer SCT3 may be, for example, about 150 to about 300 nm, while the diameter of the 3-1th scatterer SCT3_1 may be about 100 to about 500 nm. However, the diameters of the third scatterers SCT3 and the 3-1th scatterers SCT3_1 are not limited thereto.

In the first display device 10-1, the first light transmissive part LTU may directly contact the second light transmissive part LTU_1 of the first non-display area NDA-1, and in the second display device 10-2, the first wavelength conversion part WLC1 may directly contact the light transmissive part LTU_1. The light transmissive part LTU and the first wavelength conversion part WLC1 may each have a first thickness t1, and the second light transmissive part LTU_1 may have a second thickness t2. For example, the first thickness t1 and the second thickness t2 may be the same, but are not limited thereto. The first light transmissive part LTU and the second light transmissive part LTU_1 may be integral with each other or separate from each other.

As illustrated in FIG. 7, the color filter layer may further include a light blocking pattern BM_1. The light blocking pattern BM_1 may be disposed in the first and second non-display areas NDA-1 and NDA-2. For example, in the first display device 10-1, the light blocking pattern BM_1 may directly contact the third color filter CF3 on the third light emitting area LA3, and in the second display device 10-2, the light blocking pattern BM_1 may directly contact the first color filter CF1 on the first light emitting area LA1. The light blocking pattern BM_1 may include a slit portion SLP penetrating through the light blocking pattern BM_1 in the thickness direction. As illustrated in FIG. 7, it is illustrated that two slit portions SLP are formed for each of the light blocking pattern BM_1, but the disclosure is not limited thereto, and one or three or more slit portions SLP may be formed for each of the light blocking pattern BM_1.

The light blocking pattern BM_1 may have the same stacked structure as the light blocking pattern BM on the light blocking area BA. As described above, in the first display device 10-1, the light transmissive part LTU may directly contact the second light transmissive part LTU_1 of the first non-display area NDA-1, in the second display device 10-2, the first wavelength conversion part WLC1 may directly contact the light transmissive part LTU_1, and the light blocking pattern BM_1 may include the slit portion SLP. As a result, the first display device 10-1 may emit the third light generated in the third light emitting area LA3 to the outside, and the second display device 10-2 may emit the first light generated in the first light emitting area LA1 to the outside. Accordingly, there is an advantage in that it is possible to minimize a visibility discontinuity between the first display device 10-1 and the second display device 10-2 from the outside.

Figure 8:
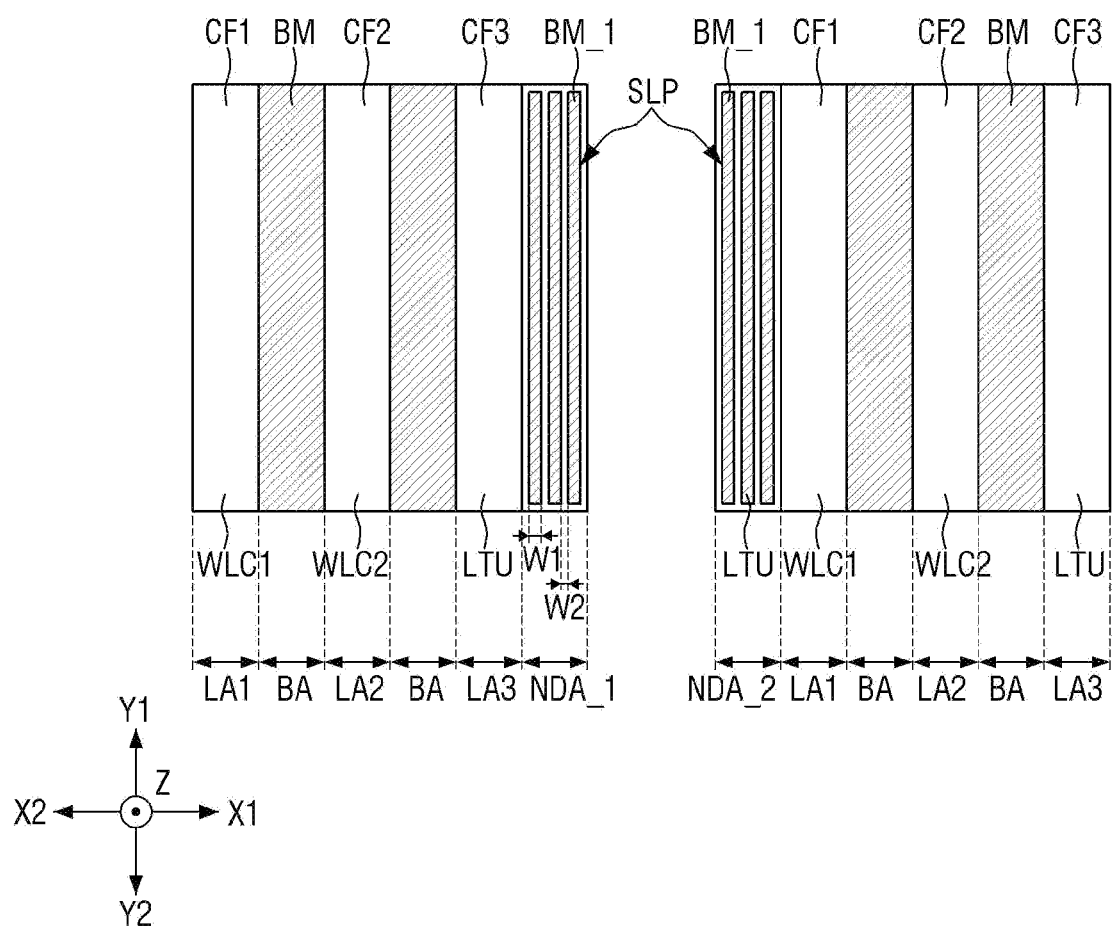
FIG. 8 is a plan view illustrating each of a color filter layer and a light conversion layer of first and second display devices adjacent to each other of FIG. 7.

FIG. 8 is a plan view illustrating each of a color filter layer and a light conversion layer of the first and second display devices adjacent to each other of FIG. 7.

Referring to FIGS. 7 and 8 together, the slit portion SLP may have a line shape extending in the second directions Y1 and Y2, and since the light blocking pattern BM_1 includes at least one slit portion SLP, the light blocking pattern BM_1 may include multiple patterns extending in the second directions Y1 and Y2 as illustrated in FIG. 8. For example, the light blocking pattern BM_1 may include multiple patterns and at least one slit portion SLP. In some embodiments, the slit portion SLP may not have the line shape extending in the second directions Y1 and Y2 as illustrated in FIG. 8, but may have an island shape or a random shape.

In case that the slit portion SLP has the line shape extending in the second directions Y1 and Y2 as in FIG. 8, a width W2 of the slit portion SLP in the first directions X1 and X2 may be about 10% to about 30% of a width W1 of the pattern of the light blocking pattern BM_1 in the first directions X1 and X2. A width of the slit portion SLP may be in a range of about 10% to about 30% of a width of the non-display area NDA_1.

As the width W2 of the slit portion SLP in the first directions X1 and X2 is about 10% or more of the width W1 of the pattern of the light blocking pattern BM 1 in the first directions X1 and X2, the light generated from the light emitting areas LA1 and LA3 adjacent to each other may be emitted to the outside through the slit portion SLP, thereby preventing the visibility of discontinuity between the display devices 10-1 and 10-2, and as the width W2 of the slit portion SLP in the first directions X1 and X2 is about 30% or less of the width W1 of the pattern of the light blocking pattern BM_1 in the first directions X1 and X2, reflection of external light in the non-display areas NDA-1 and NDA-2 may be reduced.

FIGS. 9 to 12 are schematic cross-sectional views illustrating some process steps of a method of manufacturing the first display device of FIG. 7. FIGS. 9 to 12 are views for describing a method of manufacturing the light blocking pattern BM_1 and the slit portion SLP of FIG. 7 of the first display device 10-1. Although the method of manufacturing the light blocking pattern BM_1 and the slit portion SLP will be described of the first display device 10-1, methods of manufacturing the light blocking patterns BM_1 and the slit portions SLP of the second to fourth display devices 10-2, 10-3, and 10-4 may be also the same.

Figure 9:
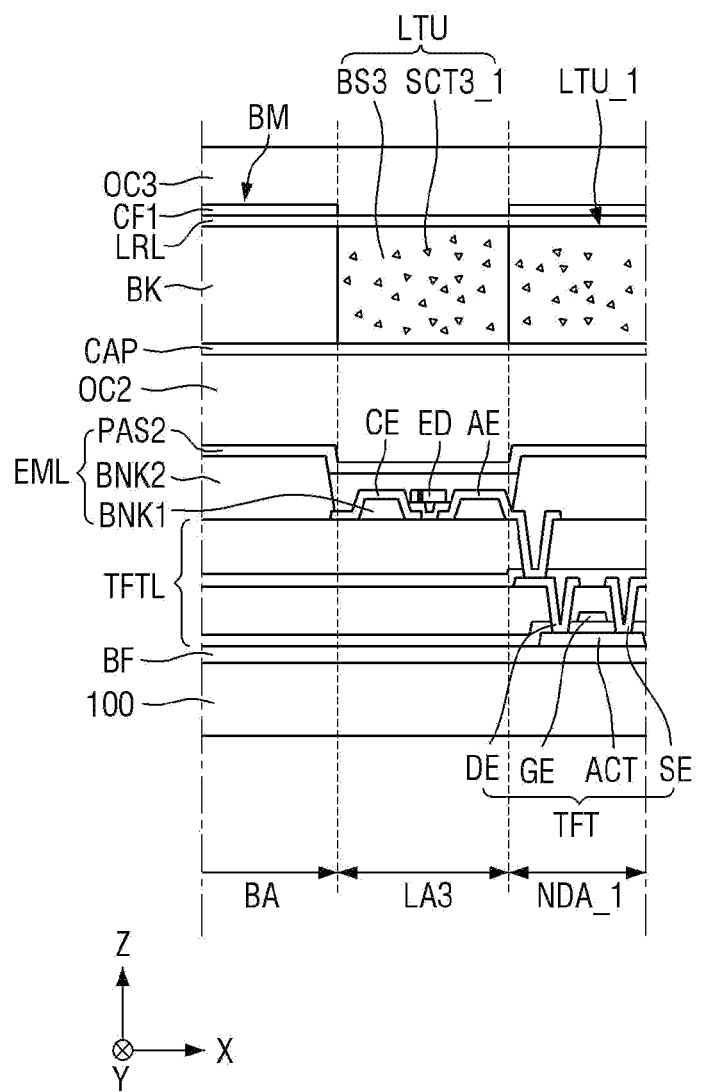
FIGS. 9 to 12 are schematic cross-sectional views illustrating some process steps of a method of manufacturing the first display device of FIG. 7.

First, referring to FIG. 9, the first color filter CF1 may be formed on an entire area of the light blocking area BA and the first non-display area NDA-1 on the low refractive layer LRL.

Figure 10:
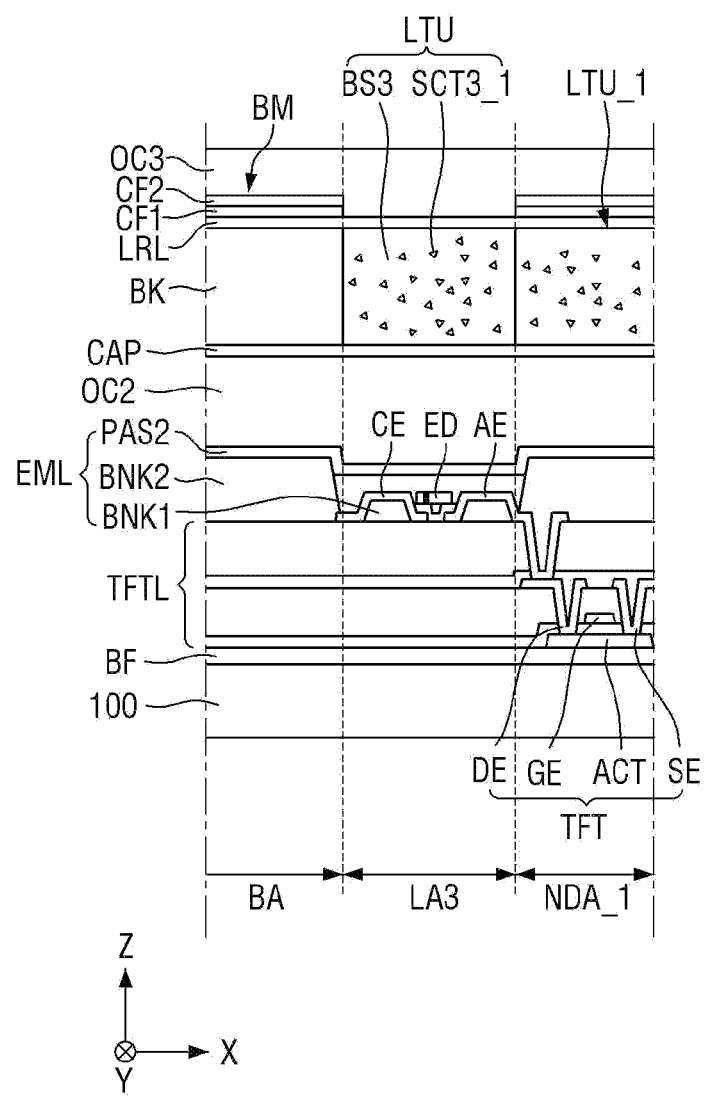

Referring to FIG. 10, the second color filter CF2 may be formed on an entire area of the light blocking area BA and the first non-display area NDA-1 on the first color filter CF1.

Figure 11:
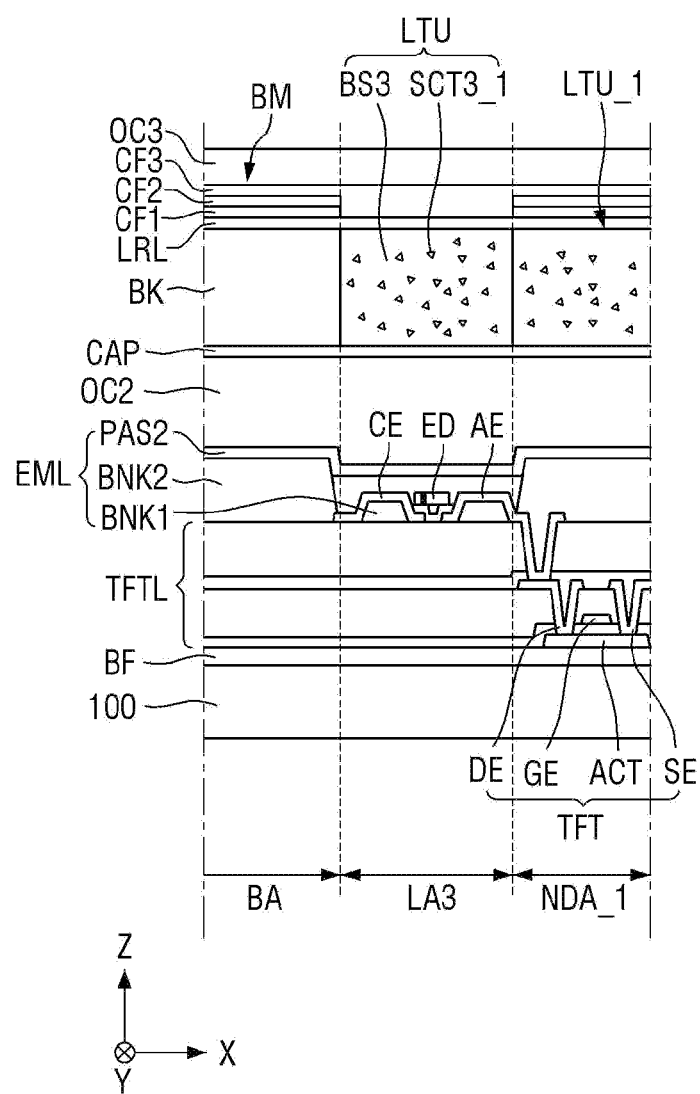

Referring to FIG. 11, the third color filter CF3 may be formed on an entire area of the light blocking area BA, the third light emitting area LA3, and the first non-display area NDA-1 on the second color filter CF2.

Figure 12:
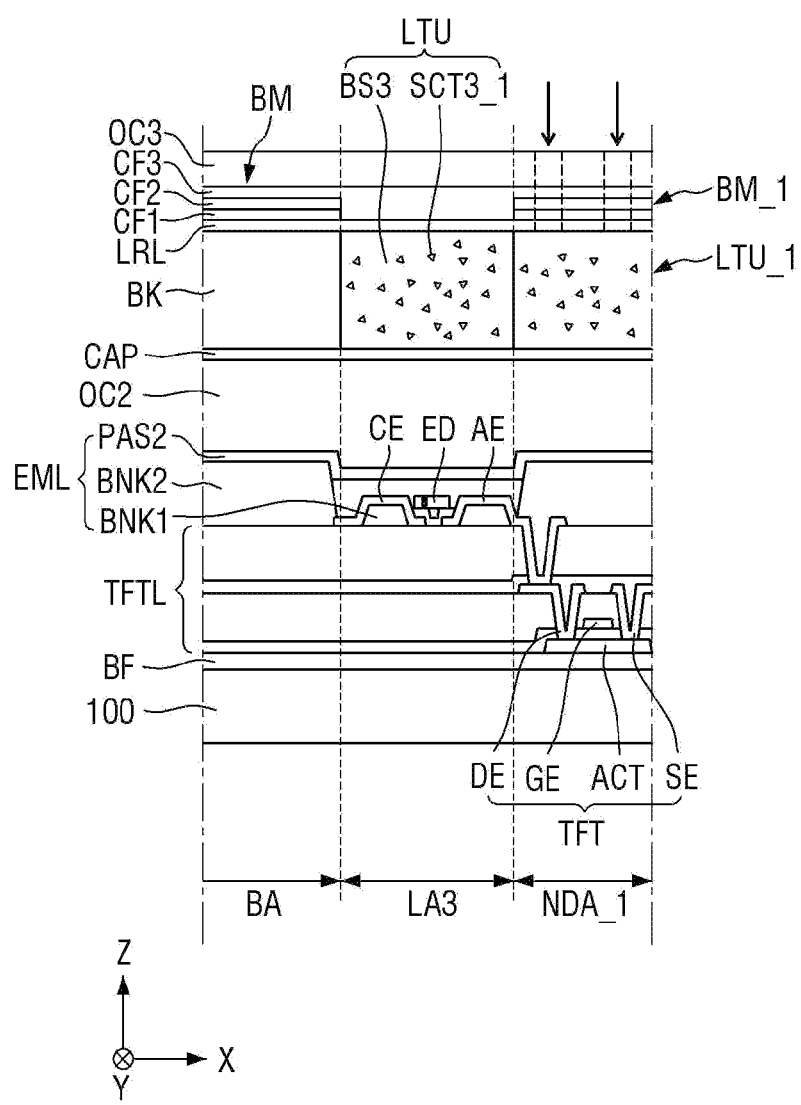

Referring to FIGS. 7 and 12, in order to form the slit portion SLP of FIG. 7, a space for forming the slit portion SLP of the first color filter CF1, the second color filter CF2, and the third color filter CF3 sequentially stacked on the first non-display area NDA-1 may be cut. A detailed description of the cutting process will be omitted.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a display area comprising:
a plurality of light emitting areas including:
a first light emitting area;
a second light emitting area; and
a third light emitting area; and
a light blocking area disposed between adjacent ones of the plurality of light emitting areas;
a non-display area disposed adjacent to the display area;
light emitting elements disposed on a substrate in each of the first light emitting area, the second light emitting area, and the third light emitting area;
a light conversion layer disposed on the light emitting elements; and
a color filter layer disposed on the light conversion layer, wherein
the light conversion layer includes:
a first wavelength conversion part disposed in the first light emitting area;
a second wavelength conversion part disposed in the second light emitting area;
a first light transmissive part disposed in the third light emitting area;
a second light transmissive part disposed in the non-display area; and
a bank disposed in the light blocking area,
the non-display area is disposed on an edge of the display area,
the bank is not overlapped with the first light emitting area, the second light emitting area, and the third light emitting area,
wherein the color filter layer includes:
a first color filter disposed in the first light emitting area;
a second color filter disposed in the second light emitting area; and
a third color filter disposed in the third light emitting area, and
wherein the first color filter, the second color filter, and the third color filter are disposed in the light blocking area and in the non-display area.

2. The display device of claim 1, wherein
the first light emitting area, the second light emitting area, the third light emitting area, and the light blocking area constitute a pixel, and
the third light emitting area of the pixel adjacent to the non-display area is disposed adjacent to the non-display area in a plan view.

3. The display device of claim 2, wherein the third light emitting area directly contacts the non-display area in a plan view.

4. The display device of claim 3, wherein the first light transmissive part directly contacts the second light transmissive part.

5. The display device of claim 4, wherein
the first wavelength conversion part includes a first wavelength shifter, and
the first wavelength shifter converts a wavelength of light from the light emitting elements into red light.

6. The display device of claim 5, wherein
the second wavelength conversion part includes a second wavelength shifter, and
the second wavelength shifter converts the wavelength of the light from the light emitting elements into green light.

7. The display device of claim 6, wherein
the first light transmissive part and the second light transmissive part include a scatterer, and
the scatterer scatters the light from the light emitting element.

8. The display device of claim 1, wherein in the non-display area, the first color filter, the second color filter, and the third color filter are sequentially stacked to form a light blocking pattern.

9. The display device of claim 8, wherein in the non-display area, the light blocking pattern includes a slit portion penetrating through the light blocking pattern in a thickness direction.

10. The display device of claim 9, wherein a width of the slit portion is in a range of about 10% to about 30% of a width of the non-display area.

11. A tiled display device comprising:
a first display device;
a second display device disposed adjacent to the first display device; and
a sealing part between the first display device and the second display device, wherein
each of the first display device and the second display device comprises:
a display area comprising:
a plurality of light emitting areas including:
a first light emitting area;
a second light emitting area; and
a third light emitting area; and
a light blocking area disposed between adjacent ones of the plurality of light emitting areas,
a non-display area disposed adjacent to the display area;
light emitting elements disposed on a substrate in each of the first light emitting area, the second light emitting area, and the third light emitting area; and a light conversion layer disposed on the light emitting elements, the light conversion layer of each of the first display device and the second display device includes:
a first wavelength conversion part disposed in the first light emitting area,
a second wavelength conversion part disposed in the second light emitting area,
a first light transmissive part disposed in the third light emitting area, and a bank disposed in the light blocking area, and a second light transmissive part is disposed in each of the non-display area of the first display device adjacent to the second display device and the non-display area of the second display device adjacent to the first display device.

12. The tiled display device of claim 11, further comprising:
a color filter layer disposed on the light conversion layer, wherein the color filter layer includes:
a first color filter disposed in the first light emitting area;
a second color filter disposed in the second light emitting area; and
a third color filter disposed in the third light emitting area, and
the first color filter, the second color filter, and the third color filter are disposed in the light blocking area and in the non-display area.

13. The tiled display device of claim 12, wherein in the non-display area, the first color filter, the second color filter, and the third color filter are sequentially stacked to form a light blocking pattern.

14. The tiled display device of claim 13, wherein in the non-display area, the light blocking pattern includes a slit portion penetrating through the light blocking pattern in a thickness direction.

15. The tiled display device of claim 14, wherein a width of the slit portion is in a range of about 10% to about 30% of a width of the non-display area.

16. The tiled display device of claim 11, wherein the second light transmissive part of the first display device directly contacts the first light transmissive part of the first display device.

17. The tiled display device of claim 16, wherein the second light transmissive part of the second display device directly contacts the first wavelength conversion part of the first light emitting area of the second display device.

18. The tiled display device of claim 17, wherein
the first wavelength conversion part includes a first wavelength shifter,
the first wavelength shifter converts a wavelength of light from the light emitting elements into red light,
the second wavelength conversion part includes a second wavelength shifter,
the second wavelength shifter converts the wavelength of the light from the light emitting elements into green light,
the first light transmissive part and the second light transmissive part include a scatterer, and
the scatterer scatters the light from the light emitting elements.

* * * * *